United States Patent
Goto et al.

(10) Patent No.: US 6,472,329 B1
(45) Date of Patent: Oct. 29, 2002

(54) ETCHING ALUMINUM OVER REFRACTORY METAL WITH SUCCESSIVE PLASMAS

(75) Inventors: Haruhiro Harry Goto, Saratoga; Kai-An Wang, Cupertino; Jenny T. Tran, San Jose, all of CA (US)

(73) Assignee: Applied Komatsu Technology, Inc., Tokyo (JP)

( * ) Notice: Subject to any disclaimer, the term of this patent is extended or adjusted under 35 U.S.C. 154(b) by 0 days.

(21) Appl. No.: 09/374,875

(22) Filed: Aug. 16, 1999

(51) Int. Cl.[7] .......................................... H01L 21/3065
(52) U.S. Cl. ...................... 438/712; 438/714; 438/717; 438/720; 438/725
(58) Field of Search ................................ 438/706, 708, 438/712, 717, 720, 725, 710, 714, 733, 734

(56) References Cited

U.S. PATENT DOCUMENTS

| | | | |
|---|---|---|---|
| 5,174,856 A | 12/1992 | Hwang et al. | 216/69 |
| 5,200,031 A | 4/1993 | Latchford et al. | 216/13 |
| 5,382,316 A | 1/1995 | Hills et al. | 216/67 |
| 5,387,556 A | 2/1995 | Xiaobing et al. | |
| 5,609,775 A | * 3/1997 | Liu | 216/77 |
| 5,780,359 A | 7/1998 | Brown et al. | 438/659 |
| 5,824,234 A | * 10/1998 | Jou et al. | 216/18 |
| 5,846,880 A | * 12/1998 | Lee | 438/669 |
| 5,869,401 A | * 2/1999 | Brunemeier et al. | 438/710 |
| 5,883,007 A | * 3/1999 | Abraham et al. | 438/714 |

FOREIGN PATENT DOCUMENTS

| | | |
|---|---|---|
| DE | 38 42 758 A1 | 6/1990 |
| DE | 39 40 820 A1 | 6/1991 |
| EP | 0 622 477 A1 | 11/1994 |
| EP | 0 917 187 A2 | 5/1999 |
| EP | 0 917 187 A3 | 1/2000 |
| JP | 57-201026 | 2/1983 |
| TW | 366577 | 8/1999 |

OTHER PUBLICATIONS

Search report mailed Sep. 13, 2001 for Singapore patent application 200004522–9.
Search report mailed Nov. 26, 2001 for European patent application 00 30 7010.

* cited by examiner

Primary Examiner—Robert Kunemund
Assistant Examiner—Binh X. Tran
(74) Attorney, Agent, or Firm—Robert J. Stern

(57) ABSTRACT

A process and apparatus for etching an exposed region of a multi-layer metal having at least two layers: a layer of aluminum or aluminum alloy, and an underlying layer of refractory metal. The etching process includes at least two steps. In a first step, the aluminum layer is etched by processing the substrate with a first plasma chemistry that etches aluminum. Optionally a portion, but not all, of the refractory metal layer also is etched by the first plasma chemistry. In a subsequent second step, the remainder of the refractory metal layer is etched by a second plasma chemistry that etches the lower refractory metal much faster than it etches aluminum. The invention minimizes undercutting of the aluminum side wall as the refractory metal layer becomes depleted.

11 Claims, 2 Drawing Sheets

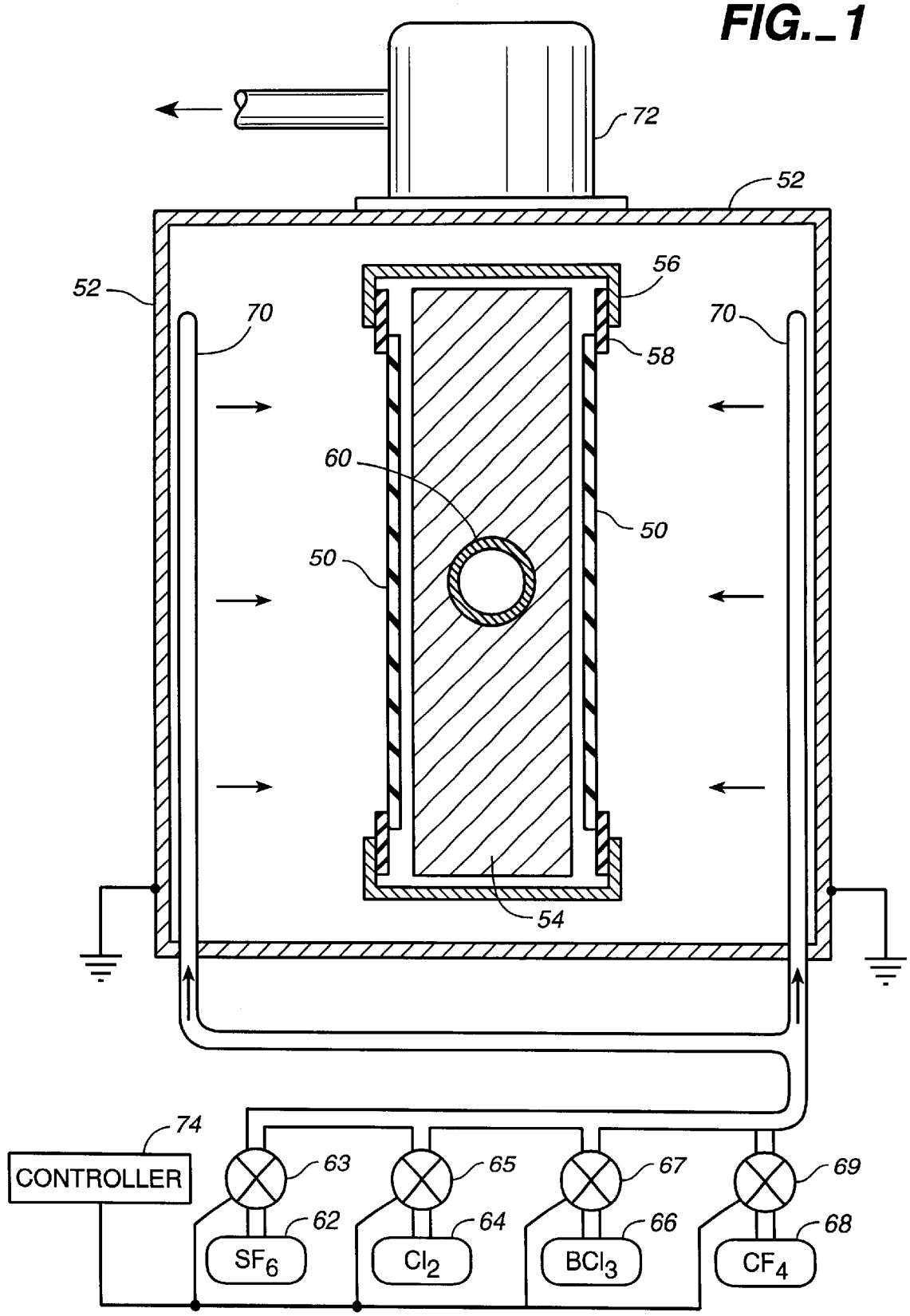
FIG._1

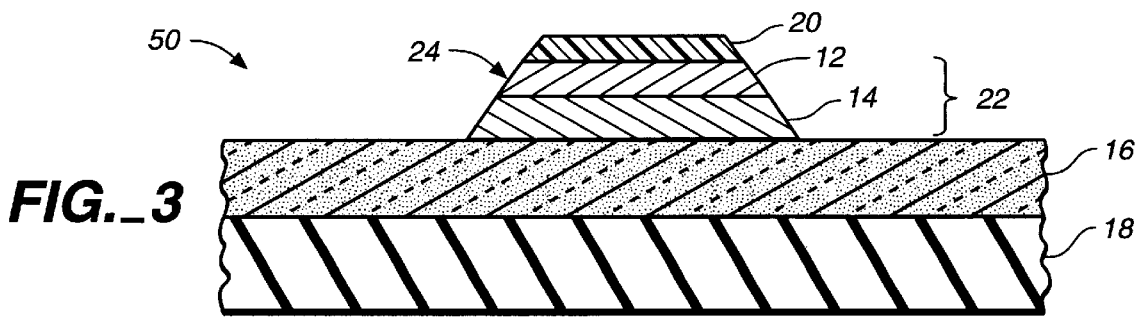
FIG._3
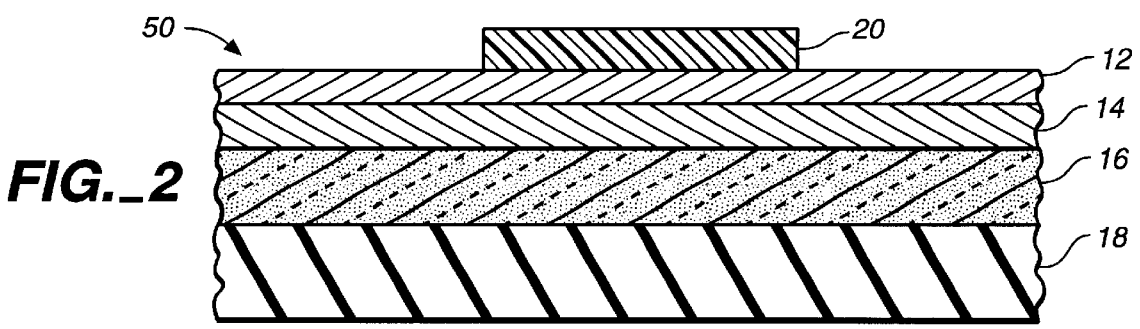
FIG._2
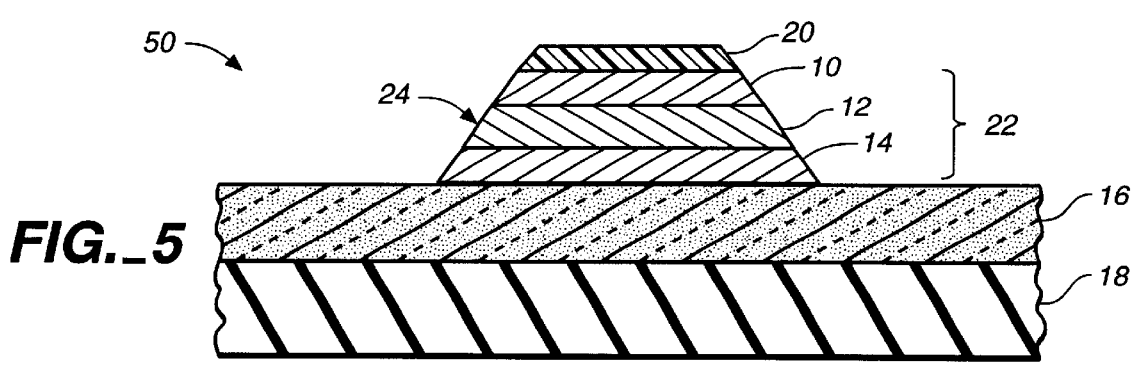
FIG._5
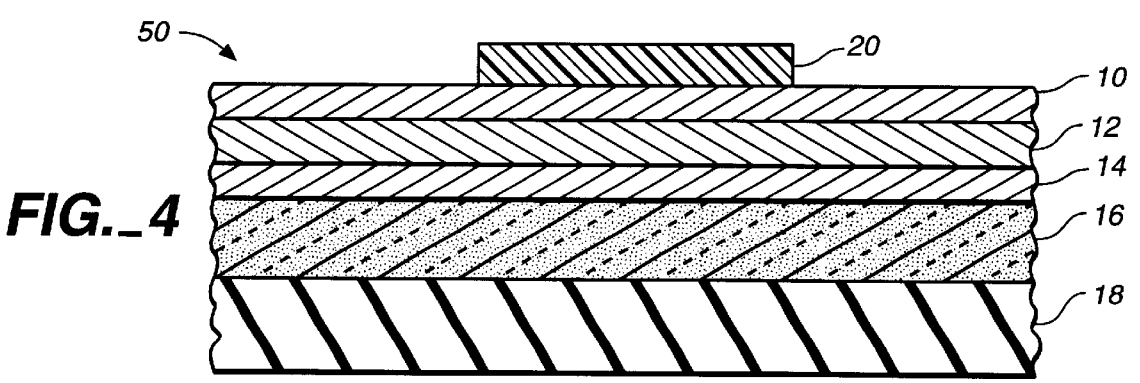
FIG._4

ETCHING ALUMINUM OVER REFRACTORY METAL WITH SUCCESSIVE PLASMAS

FIELD OF THE INVENTION

This invention relates to plasma etch processes used in the manufacture of electronic devices such as liquid crystal displays and integrated circuits. More specifically, the invention relates to processes for etching metal features having a layer of aluminum or aluminum alloy overlying a layer of a refractory metal such as titanium.

BACKGROUND OF THE INVENTION

Aluminum is the most commonly used material for fabricating electrical conductors, such as contacts and interconnect lines, in thin film transistor liquid crystal displays fabricated on glass substrates and in integrated circuits fabricated on silicon substrates. While such a conductor can be fabricated as a single layer of aluminum or aluminum alloy, an alternative approach is to fabricate the conductor as multiple layers, with a layer of refractory metal below and, optionally, above the aluminum or aluminum alloy layer. The refractory metal advantageously reduces the formation of hillocks in the conductors. In addition, when the conductor is formed over a silicon region to form a contact, a sufficiently thick bottom layer of refractory metal can prevent aluminum atoms from diffusing into the silicon.

Plasma processes for etching aluminum and aluminum alloys typically employ chlorine as the principal reagent for etching the aluminum. Chlorine ions and radicals typically are produced by plasma decomposition of one or more chlorine-containing gases such as $Cl_2$ and $BCl_3$.

One shortcoming of such chlorine-based processes is that they generally etch aluminum faster than they etch the refractory metal. This can cause undercutting of the aluminum side walls of the conductor while the refractory metal below the aluminum is being etched. Undercutting is when a material is excessively etched in a lateral direction so as to produce concave side walls, which is undesirable.

Therefore, a need exists for a plasma process that can etch a layer of aluminum or aluminum alloy overlying a layer of a refractory metal so as to produce a desired straight or tapered side wall contour, without undercutting the side walls.

SUMMARY OF THE INVENTION

In one aspect, the invention is a process and apparatus for etching an exposed region of a multi-layer metal having at least two layers: a layer of aluminum or aluminum alloy overlying a layer of refractory metal. The etching process includes at least two steps. In a first step, the aluminum layer is etched by processing the substrate with a first plasma chemistry that etches aluminum. Optionally a portion, but not all, of the lower refractory metal layer also is etched by the first plasma chemistry. In a subsequent second step, the remainder of the refractory metal layer is etched by a second plasma chemistry that etches the lower refractory metal much faster than it etches aluminum.

An advantage of the invention is that it can avoid undercutting the aluminum side wall as the refractory metal layer becomes depleted towards the end of the etch process. Specifically, we discovered that conventional processes for etching an aluminum layer over a refractory metal layer begin to etch the aluminum more isotropically near the end of the etching of the refractory metal, thereby undercutting the aluminum side walls. Our process can reduce or eliminates such undercutting by changing to a second plasma chemistry that etches aluminum either slowly or not at all.

So that the second plasma does not etch aluminum, it preferably does not include boron ions or ions heavier than argon. Preferably, the second plasma includes fluorine-containing species to etch the refractory metal. The fluorine also scavenges any chlorine or other halogens that may have been used during the aluminum etch step, and it can protect the aluminum from further etching by forming a coating of $AlF_3$ that is resistant to etching by chlorine and other reagents.

The same two step process is useful for etching an exposed region of a metal having at least three layers: an upper layer of refractory metal, a middle layer of aluminum or aluminum alloy, and a lower layer of refractory metal. The upper layer and the middle layer are etched with a first plasma chemistry. The process changes to the aforesaid second chemistry (that etches aluminum slowly or not at all) at a point in time after the aluminum layer is removed and before the etch process reaches the bottom of the lower refractory metal layer. In this embodiment, the first plasma chemistry should be capable of etching both the refractory metal of the upper layer and the aluminum of the middle layer.

In another embodiment of the invention, the two step process can be expanded to a three step process for etching an exposed region of a metal having at least the aforesaid three layers. In this embodiment, a first plasma chemistry that does not etch aluminum removes all or most of the exposed upper layer of refractory metal. A second plasma chemistry that etches aluminum (similar to the first step of the two step process) removes the aluminum layer. Optionally, the second plasma chemistry also can etch refractory metal. In a third, final step (similar to the second, final step of the two step process) a third plasma chemistry that etches the lower refractory metal much faster than it etches aluminum removes the lower layer of refractory metal. The time of the transition from the second chemistry to the third chemistry should be after the aluminum layer is removed and before the bottom of the lower refractory metal layer begins to be removed.

As in the two step process, the three step process has the advantage of reducing or eliminating undercutting of the aluminum while the lower refractory metal layer is etched. The three step process has an additional advantage of allowing the aluminum and upper refractory layers to be etched by separate process chemistries that can be optimized for etching aluminum and the refractory metal, respectively. For example, the aluminum can be etched by a process that etches the refractory metal very slowly or not at all.

In any of the above embodiments, the plasma in the final process step preferably further includes oxygen for at least two purposes. One is that the oxygen can scavenge byproducts from the preceding process steps. Another is that the oxygen can remove much of the photoresist overlying the topmost metal layer at the same time the lower refractory metal layer is being etched, thereby reducing the time required for a subsequent photoresist stripping or ashing process.

BRIEF DESCRIPTION OF THE DRAWINGS

FIG. 1 is a schematic elevation view of a plasma chamber suitable for performing the etch process of the invention.

FIGS. 2–5 are sectional views of a substrate showing various stages of etching using the processes of the present invention.

FIG. 2 shows a substrate having two blanket layers of metal and a patterned layer of resist prior to performing our etch process.

FIG. 3 shows a two layer metal feature produced by our etch process, before removal of the resist.

FIG. 4 shows a substrate having three blanket layers of metal and a patterned layer of resist prior to performing our etch process.

FIG. 5 shows a three layer metal feature produced by our etch process, before removal of the resist.

DETAILED DESCRIPTION OF THE PREFERRED EMBODIMENTS

Etch Chamber Apparatus

The process of our invention can be performed in any conventional process chamber or vacuum chamber suitable for performing plasma etch processes. FIG. 1 shows a plasma etch chamber that is especially adapted for processing large substrates, such as the glass substrates used to manufacture flat panel displays. This etch chamber can etch two workpieces 50 simultaneously. The chamber is described in more detail in commonly-assigned U.S. Pat. Nos. 5,843,277 and 5,895,549 and in commonly-assigned application Ser. No. 09/061,013 filed Apr. 15, 1998 by Goto, the entire content of each of which is hereby incorporated by reference into this patent specification.

The plasma etch chamber has an interior enclosed by an electrically grounded chamber wall 52 composed of a metal that will not contaminate the etch process, typically anodized aluminum. Two flat, rectangular workpieces or substrates 50 are mounted on opposite sides of a metal cathode electrode 54 by clamps 56. FIG. 5 shows each workpiece 50 as extending in a plane that is perpendicular to the page of the figure. Dielectric spacers 58 electrically isolate the workpieces from the clamps. The cathode 54 is mounted on a hollow shaft 60 that rotates to orient the substrates vertically as shown during plasma processing, and to orient the substrates horizontally when they are being transported into and out of the chamber.

Various process gases are supplied by gas tanks 62, 64, 66 and 68. (FIG. 1 shows four exemplary types of gases, but the other types of gases discussed below can be supplied in addition to or instead of the gases shown in the figure.) The flow rate of each gas into the chamber interior is controlled by respective flow controllers 63, 65, 67 and 69. The gases flowing from the flow controllers are dispensed into the chamber interior through two gas distribution manifolds 70. Each gas distribution manifold has a planar, rectangular array of gas outlet apertures, the plane of the array being parallel to the adjacent workpiece 50, i.e., perpendicular to the page as depicted in FIG. 5. The gases are exhausted from the chamber by pump 72, which includes a throttle valve to regulate the total gas pressure within the chamber. The arrows in FIG. 5 illustrate the direction of gas flow.

An RF electrical power supply, not shown, supplies RF power between two output terminals that are ungrounded and grounded, respectively. The ungrounded output terminal is coupled to the cathode electrode 54 via an RF transmission line that extends through the hollow shaft 60. The grounded output terminal is coupled to the chamber wall by virtue of the wall being electrically grounded. Consequently, the RF power flows between the cathode electrode and the chamber wall, which excites the gases within the chamber into a plasma state so as to form a plasma body adjacent each of the two workpieces 50. The plasma decomposes the process gas molecules into radicals and ions that can react with material exposed on the surfaces of the two workpieces.

An electrical controller 74, preferably a programmable microcomputer, sends electrical signals to the flow controllers to control their respective flow rates. The controller also sends electrical signals to the exhaust throttle valve to control the chamber pressure and to the RF power supply to control the RF power output. The master controller 74 preferably is programmable so that the process parameters such as flow rates, pressures, and power levels can be adjusted by a human operator. The various gas flow rates and gas ratios in all of the process steps described in this patent specification are controlled by the gas flow controllers 63, 65, 67, 69 in response to commands from the electrical master controller 74.

It is preferable to cool the cathode 54 on which the workpiece 50 rests to maintain the cathode at a regulated temperature, preferably about 60° to 80° C. This prevents the workpiece from becoming too hot during etching, because workpiece temperatures above 120° C. can damage typical photoresist materials 20. In the preferred etch chamber shown in FIG. 1, cooling fluid such as water is pumped through a conduit within the hollow shaft 60 so that the fluid circulates through channels within the cathode.

Initial Conditioning and Breakthrough Step

Before describing the process of our invention, it should be clarified that all embodiments of the process preferably are preceded by an initial conditioning and oxide breakthrough step. The purposes of this step include removing any water vapor absorbed in the surface of the workpiece due to exposure to ambient atmosphere, removing ("breaking through") any native oxide formed on exposed metal of the workpiece due to exposure to ambient atmosphere, and cleaning contaminants from the interior of the metal etch chamber. This step can be performed in the same plasma etch chamber used to perform the metal etch process of our invention.

Our preferred process for the initial conditioning step is sputter etching by boron ions formed by plasma decomposition of $BCl_3$ gas. Using the just described plasma etch chamber of FIG. 1, we recommend performing the conditioning and break through process for 30 to 60 seconds with a $BCl_3$ gas flow rate of 50 to 75 sccm, a chamber pressure of 15 mTorr, and an RF power of 3000 watts.

Process for Etching Two Metal Layers

In one aspect, the invention is an process and apparatus for etching the structure shown in FIG. 2 in order to produce the structure shown in FIG. 3. Specifically, the invention etches or "patterns" an exposed region of a multi-layer metal structure having a least two metal layers: a layer 12 of aluminum or aluminum alloy, and an underlying layer 14 of refractory metal. Suitable refractory metals include, but are not limited to, titanium, titanium nitride, tungsten and molybdenum.

Throughout this patent specification, we use the term "metal feature" to refer to the combination 22 of the two metal layers 12 and 14 after they have been patterned as shown in FIG. 3. We use the term "side wall" to refer to any side surface 24 of a metal feature. We use the term "aluminum" to refer to aluminum or any alloy that includes aluminum.

In typical applications, the metal feature 22 overlies and makes electrical contact with a layer 16 composed of semiconductor or conductor material. For example, layer 16 may be semiconductor material intended to function as a transistor channel, and the metal feature may be intended to contact the channel to form a source or drain electrode. The semiconductor or conductor layer 16 typically overlies a substrate 18 such as a silicon wafer or a glass substrate for a flat panel display.

Before performing our etch process, the two metal layers 12, 14 shown in FIG. 2 are formed by any conventional metal deposition process, typically a blanket metal deposition process. Then an etchant-resistant resist material 20 is deposited over the metal. The resist is patterned, typically by photo-lithography, so as to remove resist from those areas of the metal that are intended to be removed by the subsequent etch process.

After the resist is deposited and patterned, our two step plasma etch process removes all exposed regions of the multi-layer metal 12, 14, resulting in the structure shown in FIG. 3. Following our etch process, the resist 20 can be removed by a conventional resist stripping or ashing process. Suitable resist stripping processes are described in commonly-assigned U.S. Pat. Nos. 5,174,856 to Hwang; 5,200,031 to Latchford et al.; and 5,780,359 to Brown et al. The entire content of each of these patents is hereby incorporated by reference into this patent specification.

When we state that our etch process removes "exposed" regions of the multi-layer metal 12, 14, we define "exposed regions" to mean all portions of the multi-layer metal that are not covered by the resist 20. We consider such regions of the metal to be "exposed" even though the exposed surface may be covered by a thin layer of native oxide as a result of exposure of the metal to oxygen, such as oxygen in the ambient atmosphere.

The etching process includes at least two steps. In a first step, the aluminum layer 12 is etched by processing the substrate with a first plasma chemistry that etches aluminum. Optionally a portion, but not all, of the refractory metal layer 14 also is etched by the first plasma chemistry. In a subsequent second step, the remainder of the refractory metal layer 14 is etched by a second plasma chemistry that does not etch aluminum. By "plasma chemistry" we mean an atmosphere produced by plasma decomposition of one or more gases.

An advantage of the invention is that it avoids undercutting the aluminum side wall 24 as the refractory metal layer 14 becomes depleted when the etch process approaches completion. Specifically, we discovered that conventional processes for etching an aluminum layer over a refractory metal layer begin to etch the aluminum more isotropically near the end of the etching of the refractory metal, thereby undercutting the aluminum. Our process reduces or eliminates such undercutting by changing the etching process, before the bottom of the refractory metal layer begins to be removed, to a second plasma chemistry that etches the lower refractory metal much faster than it etches aluminum. Preferably, the transition from the first plasma chemistry (first atmosphere) to the second plasma chemistry (second atmosphere) is performed immediately after the exposed aluminum layer is removed, i.e., near the beginning of the etching of the refractory metal layer.

The first and second atmospheres can be produced in two different process chambers, but preferably they are produced in the same chamber. The controller 74 controls the mass flow controllers 63–69, exhaust throttle valve, and RF power supply so as to change the process gases, chamber pressure, RF power, and other process conditions from those of the first plasma chemistry to those of the second plasma chemistry.

Our two step etch process now will be described in more detail.

Step 1—Etching Aluminum Layer

The first process step removes all the aluminum in the aluminum layer 12. There is no need to employ a chemistry that minimizes etching of the refractory metal layer 14. Preferably the first process step should etch the aluminum in a manner that produces a side wall 24 having a desired taper angle without undercutting.

The first process step can employ any conventional plasma process for etching aluminum. In our preferred process the aluminum is etched primarily by chlorine radicals and ions produced by plasma decomposition of chlorine-containing gases. Specifically, our preferred process gases are $Cl_2$ and $BCl_3$, which is a conventional gas mixture for reactive ion etching of aluminum.

In many applications, such as the manufacture of flat panel displays, it is desirable to produce a metal feature 22 having side walls 24 that are not vertical, but that have a taper relative to the vertical axis as shown in FIG. 3. (Since the taper angle is measured relative to the vertical axis, a vertical side wall is said to have zero taper.)

The plasma decomposition of $BCl_3$ produces relatively heavy boron ions that sputter etch the substrate concurrently with the reactive etching by the chlorine radicals. An important advantage of sputter etching is that it etches the upper corners of the resist 20 and the metal features 22, thereby tapering the side wall 24. Increasing the ratio of $BCl_3$ to $Cl_2$ increases the taper of the side wall 24. Accordingly, the master controller 74 can produce a desired taper angle by commanding flow controllers 65 and 67 to adjust the ratio of the two flow rates.

For example, in one preferred process the chlorine gas flow rate is 100 sccm and the $BCl_3$ gas flow rate is 70 sccm. The chamber pressure is 10 to 15 mTorr, and the RF power is 2000 to 3000 watts. Argon gas also may be supplied to the plasma chamber.

As the exposed region of the aluminum begins to be depleted, so that the amount of aluminum surface exposed to the reagents begins to decline, the etch process typically becomes more isotropic so as to risk undercutting of the aluminum side walls. To avoid this effect, the flow rates of both the $Cl_2$ and the $BCl_3$ preferably should be decreased toward the end of the aluminum etching. We recommend monitoring the amount of aluminum exposed to the reagents using a conventional optical emission detector, also called an endpoint detector, with a filter for detecting a band of wavelengths centered on 396 nm, an emission line of aluminum. When the intensity of the 396 nm emission begins to decline, the flow rates of the $Cl_2$ and the $BCl_3$ should be decreased. In the preferred process just described, the $Cl_2$ and $BCl_3$ gas flow rates are decreased to 50 sccm and 40 sccm, respectively.

As a less preferred alternative to decreasing the reagent gas flow rates during the aluminum etching, the flow rates can be maintained constant at a value intermediate between the initial and decreased rates specified above.

The aluminum etch step optionally also includes a fluorohydrocarbon gas or a fluorocarbon gas, preferably $CF_4$, for the purpose of depositing a "passivation layer" of polymer material on the aluminum side walls 24 in order to prevent undercutting of the aluminum which would give the side walls an undesirable concave contour. In one set of successful tests, the $CF_4$ flow rate was 20 sccm along with $Cl_2$ and $BCl_3$ flow rates of 50 sccm and 40 sccm, respectively.

The aluminum etch should be continued until all the aluminum of the exposed region is removed, preferably as indicated by a steep decline of an aluminum emission line detected by a conventional optical endpoint detector, described above. Excluding the initial breakthrough stage, we performed the main aluminum etch for times ranging from 50 sec to 200 sec.

It is acceptable, although not preferred, to continue performing the same process used to etch the aluminum to etch some of the refractory metal layer 14. However, as described below, the transition from the first atmosphere (the process for etching aluminum) and the second atmosphere (the process for etching the lower layer of refractory metal) should be performed before the refractory metal layer 14 of the exposed region is close to being depleted.

Step 2—Etching Lower Layer of Refractory Metal

If the first plasma chemistry that is used to etch the aluminum layer 12 also is used to etch the lower refractory metal layer 14, we have discovered that the aluminum will begin to etch more isotropically, thereby undercutting the aluminum side walls 24, as the etching of the refractory metal approaches completion.

To avoid such undercutting, in our invention we terminate the aluminum etch process (first atmosphere) and then continue etching the lower refractory metal layer 14 using a second plasma chemistry that etches the lower refractory metal much faster than it etches aluminum (second atmosphere). Preferably, the second atmosphere etches the lower refractory metal faster than it etches aluminum by a factor of at least four; more preferably, by a factor of at least ten. Most preferably, the second atmosphere does not etch aluminum at all.

This final step, etching the lower refractory metal in the second atmosphere, preferably begins immediately after the exposed region of the aluminum layer is removed. Alternatively, the transition to the second plasma chemistry that does not etch aluminum can be delayed to permit the first plasma chemistry to etch some of the lower refractory metal layer 14. In this case, the transition to the second plasma chemistry should be performed before the etching of the refractory metal reaches a stage of completion in which the number of refractory metal atoms exposed to the reagents begins to decline. If the first plasma were allowed to continue after such decline, undercutting of the aluminum side walls would be likely because a declining proportion of the reagents would be consumed by the etching of the refractory metal. Stated somewhat differently, the transition should be performed before the bottom of the lower refractory metal layer becomes so depleted as to begin to expose the underlying material 16 to the reagents.

So that the second plasma does not etch aluminum, it preferably does not include boron ions or ions heavier than argon. Preferably, the second plasma includes fluorine-containing species because fluorine can etch many refractory metals such as titanium, titanium nitride, molybdenum and tungsten. The fluorine also scavenges any chlorine or other halogens that may have been used during the aluminum etch step, and it can protect the aluminum from further etching by forming a coating of $AlF_3$ that is resistant to etching by chlorine and other reagents.

Examples of gases that can be supplied to the plasma chamber (FIG. 1, gas supplies 62–68) to dissociate into fluorine ions and other fluorine-containing species include $CF_4$, $SF_6$, $NF_3$, $CHF_3$, and $F_2$. When the refractory metal layer 14 is titanium, $CF_4$ is preferred because it etches the titanium at a moderate rate that can produce a uniform taper angle on the side wall of the lower refractory metal layer 14. The controller 74 can adjust the flow rate of the $CF_4$ and other gases to achieve a desired taper angle. $SF_6$ and $NF_3$ typically are less desirable because they can yield an uncontrollably high amount of fluorine radicals that can undercut the side walls of the refractory metal layer.

With a refractory metal layer of titanium, we successfully tested the final etch step using $CF_4$ gas flow rates ranging from 20 sccm to 200 sccm at a chamber pressure ranging from 25 mTorr to 40 mTorr and RF power ranging from 1500 watts to 3000 watts.

The plasma in the final process step preferably further includes oxygen-containing species for at least two reasons. One is that the oxygen can scavenge byproducts from the preceding process steps. For example, it can scavenge carbon-containing byproducts produced by the use of carbon-containing gases such as $CF_4$, and it can scavenge sulfur-containing byproducts resulting from the use of $SF_6$ during the aluminum etch step. Another reason to include oxygen is that it can remove much of the resist 20 at the same time the lower refractory metal layer 14 is being etched, thereby reducing the time required for a subsequent resist stripping or ashing process. In the above-mentioned tests with a refractory metal layer of titanium, we successfully employed $O_2$ gas flow rates ranging from 40 sccm to 300 sccm.

If a sufficient amount of a fluorine-containing gas species is supplied to the plasma chamber, then $Cl_2$ and argon gases also can be supplied to the chamber without causing etching of the aluminum. The latter gases may be desirable to optimize the etching of the refractory metal layer. The fluorine reacts with the aluminum to form a coating of $AlF_3$ that protects the aluminum side wall from being etched by $Cl_2$ or argon.

However, supplying gases that dissociate into boron ions or ions heavier than argon typically will break through the $AlF_3$ and etch the aluminum side wall. A small amount of aluminum etching may be desirable during the final etching of the refractory metal in order to increase the taper angle of the aluminum side wall 24. To preserve the advantages of the invention in avoiding undercutting of the aluminum, the aluminum etch rate should be a small fraction (for example, less than one-fourth) of the refractory metal etch rate during this final etch step. With substrates in which the refractory metal was titanium, and using a final etch process chemistry including $CF_4$ as described above, we successfully added 20 sccm $Cl_2$ and 20 sccm $BCl_3$ to the process gas mixture, both with and without 70 sccm argon.

Two Step Process for Etching Three or More Metal Layers

The two step process just described also can be used to etch an exposed region of a multi-layer metal conductor that includes at least an additional upper layer of refractory metal, i.e, a conductor having at least an upper layer of refractory metal 10 in addition to the middle layer 12 of aluminum or aluminum alloy and the lower layer 14 of refractory metal. FIG. 4 shows such a structure on which a layer of resist 20 has been deposited and patterned. FIG. 5 shows the structure after our etch process has removed the metal region exposed by the resist so as to leave behind the three layer metal feature 22.

Before performing our etch process, the metal layers 10, 12, 14 shown in FIG. 4 are formed by any conventional metal deposition process, typically a blanket metal deposition process. Then an etchant-resistant resist material 20 is deposited over the metal, and the resist is patterned so as to remove resist from (i.e., so as to "expose") all regions of the metal that are intended to be removed by our subsequent etch process.

All metal layers 10, 12 except for the lowermost refractory metal layer 14 can be etched by a first plasma chemistry (i.e., a first atmosphere formed by plasma decomposition of a first gas mixture) that is capable of etching all of the metals of which those layers are composed. To maximize uniformity of the side wall taper, the parameters of the first plasma process preferably should be adjusted so that each type of metal in the layers 10, 12 above the lower refractory metal layer 14 is etched at approximately the same rate.

We tested our two step process on 55 cm×67 cm glass substrates 50 having an upper layer 10 of titanium 1000 Å thick, a middle layer 12 of aluminum 1800 Å thick, and a lower layer 14 of titanium 800 Å thick. In the first step of this two step process, we successfully etched both the upper titanium layer and the middle aluminum layer using a first plasma formed by decomposition of chlorine and argon gases. Using the previously described plasma etch chamber shown in FIG. 1, we supplied 80 sccm argon gas and 40 sccm chlorine gas to the chamber at a chamber pressure of 12 mTorr and an RF power of 3500 watts to form the plasma. We obtained more uniform sidewall tapers when we added $CF_4$ gas at a flow rate of 20 sccm and reduced the $Cl_2$ gas flow rate to 30 sccm.

We also obtained good results by adding $BCl_3$ to the process gases. Specifically, the gas flows to the chamber were 30 to 45 sccm $BCl_3$, 105 to 120 sccm Ar, 80 to 90 sccm $Cl_2$, and 20 sccm $CF_4$. Other process conditions remained the same as in the preceding paragraph.

The transition from the first plasma chemistry to the second, final plasma chemistry that etches the lower refractory metal much faster than it etches aluminum should begin at a point in time after the aluminum layer is removed and before the etch process reaches the bottom of the lower refractory metal layer. As described above, changing to this second plasma chemistry has the advantage of avoiding undercutting of the aluminum side walls toward the end of the etching of the lower refractory metal layer.

The second plasma chemistry can perform an additional function when there is a refractory metal layer 10 above the aluminum layer 12. It is difficult to adjust the first plasma process so that it etches the refractory metal of the upper layer 10 and the aluminum layer 12 at the same rate. Typically the aluminum etches faster than the refractory metal. This can result in the side wall of the upper refractory metal layer 10 having a more vertical slope than that of the aluminum layer. Worse, the side wall of the upper refractory metal layer may overhang the side wall of the aluminum layer, creating a concave side wall contour.

The second plasma chemistry can overcome the effects of the upper refractory metal being etched more slowly than the aluminum by performing additional etching of the upper refractory metal while etching the lower refractory metal. If the two refractory metals are the same, as in our example in which they both are titanium, then it is inherent that the second plasma chemistry that etches the lower layer also will etch the upper layer.

If the two refractory metals are different, many species that etch one refractory metal will etch other refractory metals, so it should be feasible to select a second plasma chemistry that etches both the upper and the lower refractory metals. For example, we stated earlier that the second plasma can include both fluorine-containing species and chlorine-containing species. The fluorine will passivate the aluminum to protect the aluminum from being etched by chlorine provided the second plasma does not also include boron ions or any ions heavier than argon. A plasma including both fluorine and chlorine would be expected to etch almost any refractory metal.

As stated above, we tested the two step process using a substrate having an upper layer 10 of titanium 1000 Å thick, a middle layer 12 of aluminum 1800 Å thick, and a lower layer 14 of titanium 800 Å thick. After performing the first plasma step described above, we performed a second or final plasma process that did not etch aluminum using gas flows to the plasma chamber of 100 sccm to 200 sccm $CF_4$ and 100 sccm to 200 sccm $O_2$ at a chamber pressure of 25 mTorr and RF power of 3000 to 3500 watts for 60 seconds. The best results were at the lowest gas flow rates and power. This final plasma process successfully avoided undercutting of the aluminum side walls, and it appeared to improve the taper of the top titanium layer. We also had good results using 100 sccm $SF_6$ (in place of the $CF_4$) with 30 sccm $O_2$ at a chamber pressure of 12 mTorr for 60 to 90 seconds.

Three Step Process

An additional step can be added to the two step process just described for etching an exposed region of a metal having three layers, as shown in FIG. 4.

The three step process differs from the two step process in that the upper refractory metal layer 10 is not etched by the same plasma process used to etch the aluminum layer 12. Instead, all or most of the exposed upper layer of refractory metal is removed by a first plasma chemistry that does not etch aluminum. A second plasma chemistry that etches aluminum (similar to the first step of the two step process) removes the aluminum layer. Optionally, the second plasma chemistry also can etch refractory metal.

The final step of the three step process is the same as the final step of the two step process: after the exposed region of the aluminum layer 12 is completely removed, the remainder of the lower refractory metal layer 14 is removed with a plasma chemistry that etches the lower refractory metal much faster than it etches aluminum. The purposes, advantages and process parameters of this final step are the same as discussed above.

So that the first and third plasmas do not etch aluminum, they preferably do not include boron ions or ions heavier than argon. Preferably, the first and third plasmas include fluorine-containing species to etch the refractory metal. The purposes and advantages of including fluorine are the same as discussed above in connection with the two step processes.

As in the two step process, the three step process has the advantage of reducing or eliminating undercutting of the aluminum during the final step of etching the lower refractory metal layer. The three step process has an additional advantage of eliminating the need for a process that can etch the upper refractory metal and the aluminum at approximately the same rate. The upper refractory metal layer 10 and the aluminum layer 12 are primarily etched by separate process chemistries that can be independently optimized to achieve the desired taper and uniformity of the side walls of the refractory metal and aluminum, respectively. For example, the aluminum can be etched by a process that etches the refractory metal very slowly or not at all. Therefore, the three step process affords more flexibility for optimization than the two step process. Depending on the application, the benefit of this flexibility may outweigh the additional complication of the third step.

Our three step etch process now will be described in more detail.

In the first process step, the first plasma chemistry removes the upper layer 10 of refractory material by exposing the workpiece 50 to an atmosphere that etches the upper refractory material without etching aluminum.

Our preferred reactive species for this first step is fluorine because it effectively etches refractory materials such as titanium, titanium nitride, molybdenum and tungsten, but it does not etch aluminum. Fluorine radicals and ions preferably are produced by plasma decomposition of a fluorine-containing gas such as $SF_6$, $CF_4$, $NF_3$, $CHF_3$, and $F_2$.

Preferably, helium gas also is supplied to the plasma chamber to enhance dissociation of the fluorine-containing gas. If a sufficient amount of fluorine-containing gas is supplied, then $Cl_2$ and argon gases also can be supplied without etching the underlying aluminum layer. As explained earlier, the fluorine protects aluminum from etching by chlorine and argon. On the other hand, gases that decompose into boron ions or ions heavier than argon generally will etch aluminum.

To maximize etching uniformity, the first etch process step preferably should be continued for a time period sufficient to ensure that all of the upper refractory metal layer 10 is removed, most preferably with the duration extended somewhat beyond this sufficient period so as to provide a margin of error to ensure uniform elimination of all exposed refractory metal. Because our preferred fluorine-containing gas mixture does not etch aluminum to any appreciable extent, extending the duration of the etch will not risk etching into the aluminum layer 12.

A less preferred but acceptable alternative is to proceed to the subsequent aluminum etching step after most, but not all, of the first layer is removed. This alternative may be satisfactory if the aluminum etching process includes one or more species that can complete the etching of the upper refractory metal layer 10.

Using the previously described plasma chamber of FIG. 1, we tested our etching process on 55 cm×67 cm glass substrates 50 having an upper layer 10 of titanium 1000 Å thick, a middle layer 12 of aluminum 1800 Å thick, and a lower layer 14 of titanium 800 Å thick.

For the first process step, we obtained good results using $SF_6$ as the process gas at flow rates ranging from 250 sccm to 400 sccm, the latter being preferred. The chamber pressure was 40 mTorr. The results were acceptable without helium, but were better with helium gas at a flow rate of 300 sccm. The 13.56 MHz RF power applied to the cathode 54 ranged from 1000 watts to 2500 watts. We observed photoresist damage at 2500 watts, so we adopted 1500 watts as our preferred power level. We tested this process step for durations ranging from 215 sec to 320 sec, and we found the preferred range was about 240 sec to 290 sec to ensure complete removal of the 1000 Å titanium layer.

Although not preferred, it would be acceptable for the first process step to include process gases that etch aluminum to some extent, so long as the first layer of refractory metal is etched at a substantially higher rate than the aluminum.

The second process step removes all the aluminum in the second layer 12. This process can be the same as the aluminum etch process step in the previously discussed process for etching two metal layers. All factors discussed above regarding performance and optimization of the aluminum etch step of the two layer process apply to the aluminum etch step of the three step process.

Similarly, the final step of the three step process, removal of the lower refractory metal layer 14, can be the same as the final step of any of the previously discussed processes. Like the final step of the previously discussed two step process for etching a three layer metal, the final step of the three step process typically will modify the taper of the upper refractory metal layer 10.

We claim:

1. A method of etching an exposed region of a multi-layer metal on a semiconductor workpiece, wherein the metal includes at least a first layer of refractory metal underlying a second layer of aluminum or aluminum alloy, comprising the steps of:

providing a semiconductor workpiece that includes
an exposed region of a multi-layer metal that includes at least a first layer composed of a first refractory metal underlying a second layer composed of aluminum or aluminum alloy, and
other material underlying the multi-layer metal on the workpiece;

exposing the workpiece to a first atmosphere that etches aluminum, wherein the first atmosphere is produced by plasma decomposition of a first gas mixture; and subsequently exposing the workpiece to a second atmosphere that etches the first refractory metal faster than it etches aluminum, wherein the second atmosphere is produced by plasma decomposition of a second gas mixture;

wherein the first gas mixture includes a fluorocarbon compound; and wherein the second gas mixture includes an oxygen-containing species.

2. A method according to claim 1, wherein said fluorocarbon compound is $CF_4$.

3. A method according to claim 1, wherein said fluorocarbon compound is a fluorohydrocarbon compound.

4. A method of etching an exposed region of a multi-layer metal on a semiconductor workpiece, wherein the metal includes at least a first layer of refractory metal underlying a second layer of aluminum or aluminum alloy, comprising the steps of:

providing a semiconductor workpiece that includes
an exposed region of a multi-layer metal, wherein the multi-layer metal includes at least a first layer composed of a first refractory metal, a second layer composed of aluminum or aluminum alloy overlying the first layer, and a third layer overlying the second layer, the third layer being composed of a second refractory metal; and
other material underlying the multi-layer metal on the workpiece;

exposing the workpiece to a first atmosphere having a chemistry that etches both aluminum and the second refractory metal, wherein the first atmosphere is produced by plasma decomposition of a first gas mixture; and subsequently exposing the workpiece to a second atmosphere having a chemistry that etches the first refractory metal faster than it etches aluminum, wherein the second atmosphere is produced by plasma decomposition of a second gas mixture;

wherein the step of exposing the workpiece to the first atmosphere is performed until the third layer of the exposed region is removed and all of the aluminum in the second layer of the exposed region is removed.

5. A method according to claim 4, wherein the second atmosphere does not etch aluminum.

6. A method according to claim 4, wherein the second gas mixture does not include any compound of boron or any compound of any element having an atomic mass greater than the atomic mass of argon.

7. A method according to claim 4, wherein:
the second gas mixture includes a fluorine-containing species.

8. A method according to claim 4, wherein the first refractory metal and the second refractory metal are the same.

9. A method of etching an exposed region of a multi-layer metal on a semiconductor workpiece, wherein the metal includes at least a first layer of refractory metal underlying a second layer of aluminum or aluminum alloy, comprising the steps of:

providing a semiconductor workpiece that includes
an exposed region of a multi-layer metal that includes at least a first layer composed of aluminum or aluminum alloy overlying the first layer composed of a refractory metal, and other material underlying the multi-layer metal on the workpiece;

exposing the workpiece to a first atmosphere that etches aluminum, wherein the first atmosphere is produced by plasma decomposition of a first gas mixture; and subsequently exposing the workpiece to a second atmosphere that etches the refractory metal faster than it etches aluminum, wherein the second atmosphere is produced by plasma decomposition of a second gas mixture;

wherein the first gas mixture includes a compound of boron; and wherein the second gas mixture does not include any compound of boron or any compound of any element having an atomic mass greater than the atomic mass of argon.

10. A method according to claim 9, wherein said compound of boron is $BCl_3$.

11. A method of etching an exposed region of a multi-layer metal on a semiconductor workpiece, wherein the metal includes at least a first layer of refractory metal underlying a second layer of aluminum or aluminum alloy, comprising the steps of:

providing a semiconductor workpiece that includes
an exposed region of a multi-layer metal that includes at least a first layer composed of a first refractory metal underlying a second layer composed of aluminum or aluminum alloy, and other material underlying the multi-layer metal on the workpiece;

exposing the workpiece to a first atmosphere that etches aluminum, wherein the first atmosphere is produced by plasma decomposition of a first gas mixture; and subsequently exposing the workpiece to a second atmosphere that etches the refractory metal faster than it etches aluminum, wherein the second atmosphere is produced by plasma decomposition of a second gas mixture;

wherein the first gas mixture includes a compound of carbon; and wherein the second gas mixture includes an oxygen-containing species.

* * * * *